United States Patent [19]

Mikolajczak

[11] Patent Number: 4,845,590
[45] Date of Patent: Jul. 4, 1989

[54] HEAT SINK FOR ELECTRICAL COMPONENTS

[75] Inventor: Christopher Mikolajczak, Troy, Mich.

[73] Assignee: Chrysler Motors Corporation, Highland Park, Mich.

[21] Appl. No.: 115,951

[22] Filed: Nov. 2, 1987

[51] Int. Cl.⁴ ............................................. H05K 7/20
[52] U.S. Cl. ................................. 361/386; 361/388; 361/419; 174/16.3; 267/158; 165/80.3
[58] Field of Search .................... 165/80.2, 80.3, 185; 248/500, 316.7, 505, 510; 267/158, 164, 181; 174/16 HS; 357/75, 81, 79; 363/141; 361/382, 383, 386, 387, 388, 417–420, 427

[56] References Cited

U.S. PATENT DOCUMENTS

| | | |
|---|---|---|
| 3,711,752 | 1/1973 | Nier . |
| 3,893,161 | 7/1975 | Pesak, Jr. . |
| 4,115,836 | 9/1978 | Hutchison et al. . |
| 4,203,488 | 5/1980 | Johnson et al. . |
| 4,259,685 | 3/1981 | Romano . |
| 4,288,839 | 9/1981 | Prager et al. . |
| 4,444,994 | 4/1984 | Baker et al. . |
| 4,509,839 | 4/1985 | Lavochkin . |
| 4,587,593 | 5/1986 | Liautaud .............................. 361/383 |
| 4,605,986 | 8/1986 | Bentz ................................... 361/386 |
| 4,609,040 | 9/1986 | Moore . |
| 4,613,925 | 9/1986 | Mohri et al. . |
| 4,625,260 | 11/1986 | Jordan et al. . |
| 4,636,107 | 1/1987 | Casler ................................... 267/164 |
| 4,669,028 | 5/1987 | Faa, Jr. . |
| 4,674,005 | 6/1987 | Lacz . |
| 4,707,726 | 11/1987 | Tinder ............................. 174/16 HS |

OTHER PUBLICATIONS

IBM Technical Disclosure Bulletin, vol. 24, No. 7B, Dec., 1981.

Primary Examiner—Gerald P. Tolin
Attorney, Agent, or Firm—Mark P. Calcaterra

[57] ABSTRACT

A heat sink assembly to dissipate heat from electrical components to a housing is disclosed. The housing is formed from a suitable heat sinking material including a body with integral continuous walls extending from the perimeter of the body. A carrier mechanism which retains a plurality of electrical components is positioned within the housing. The electrical components have heat sink tabs which are positioned in the housing such that the tabs are coupled with the housing to dissipate heat from the electrical components to the housing. A resilient biasing member including a plurality of resilient fingers is coupled with the carrier mechanism to retain the carrier and electrical components in position on the housing.

20 Claims, 3 Drawing Sheets

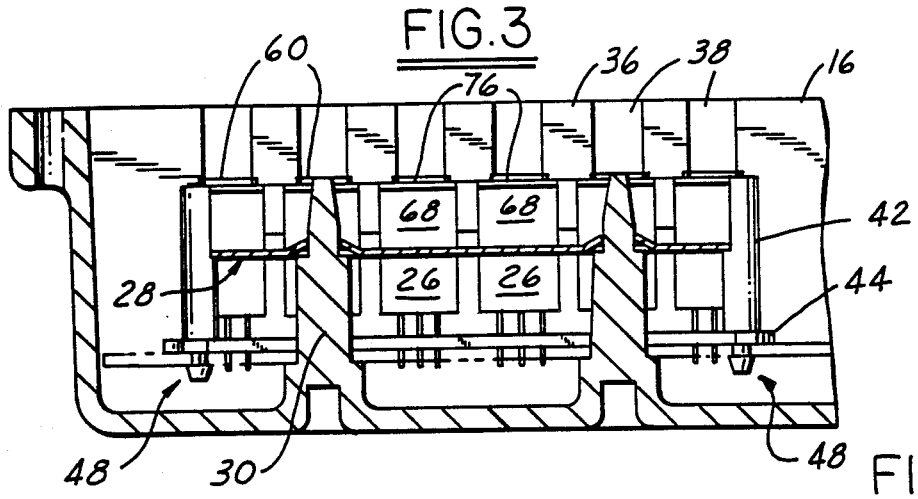
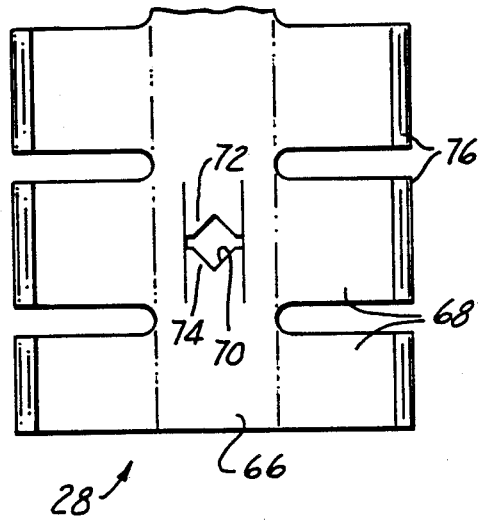
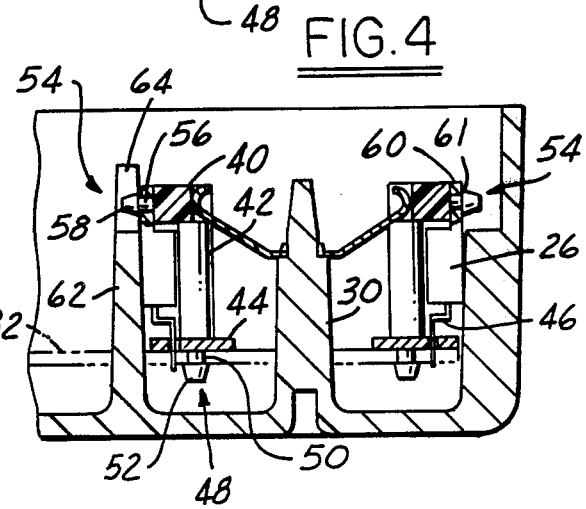
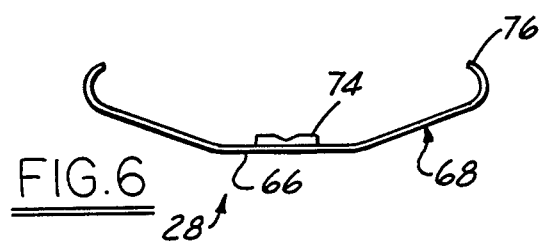
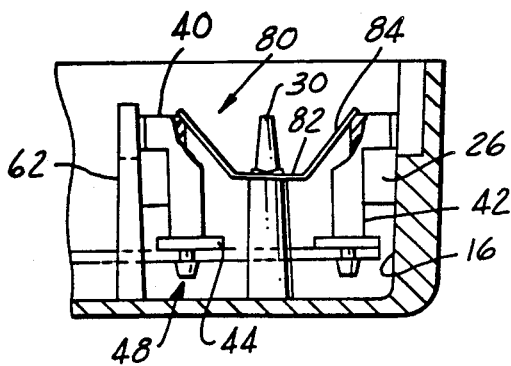
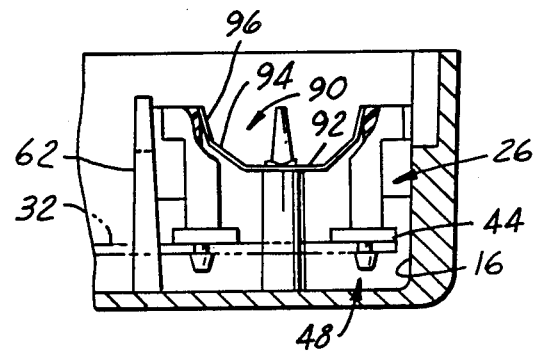

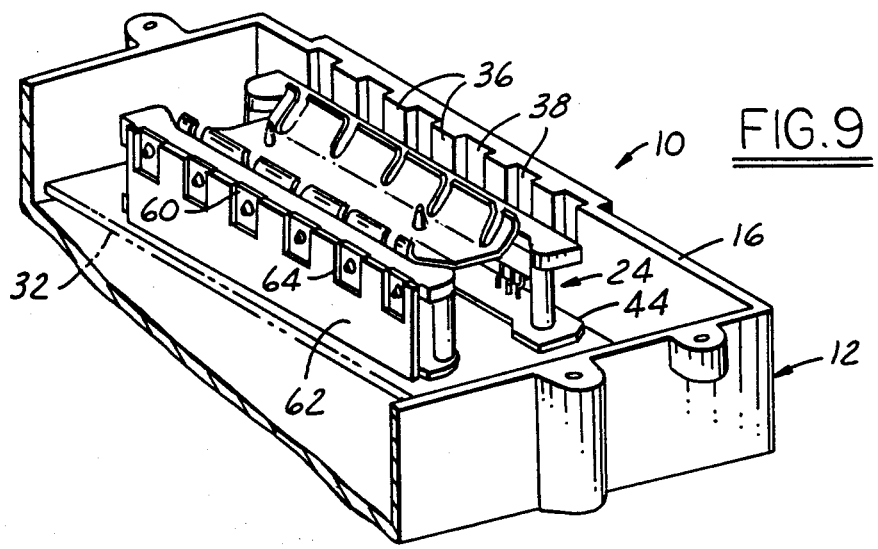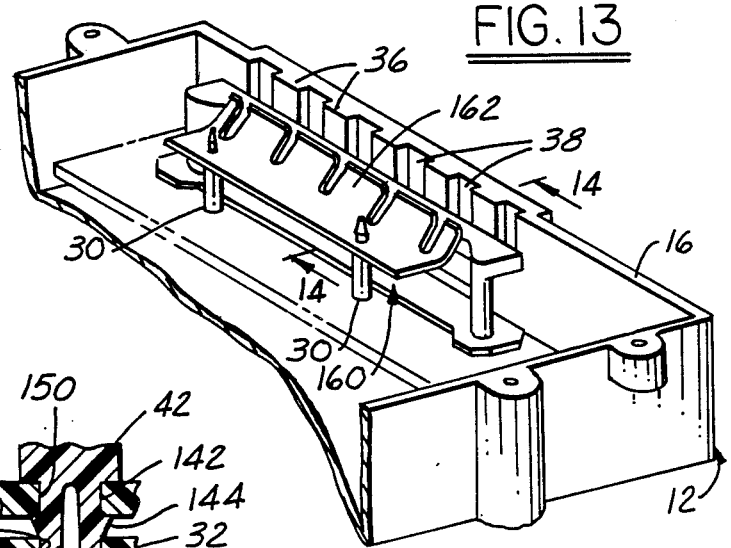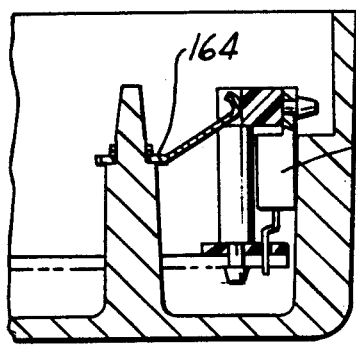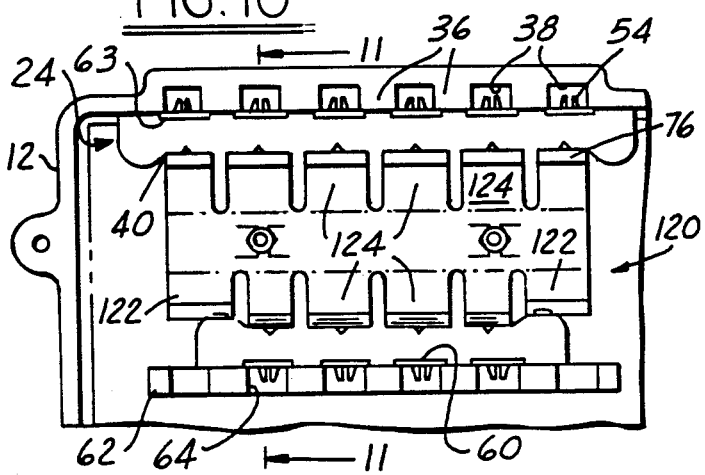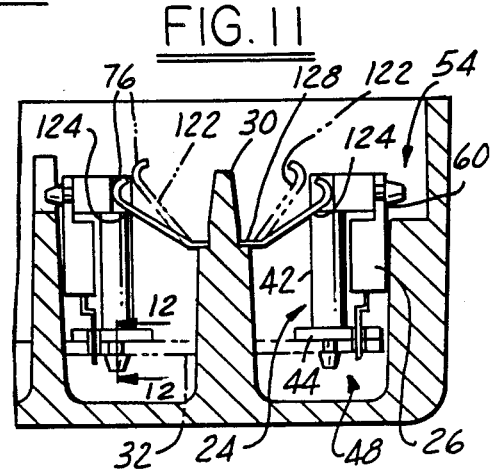

HEAT SINK FOR ELECTRICAL COMPONENTS

BACKGROUND AND SUMMARY OF THE INVENTION

The present invention relates to heat sinks and, more specifically, to heat sinks utilizing a resilient biasing member to retain electrical components with heat sink tabs against a heat sink housing. The tabs dissipate heat from the electrical components to the housing.

In electronic modules, various components generate amounts of heat which cannot be adequately dissipated to the ambient surrounding without the utilization of a heat sink. Printed circuit boards are used to provide a support for the electrical conductors and the associated electrical components, generally solid state devices, that make up the electronic module. In order to have an effective transfer of heat from the solid state device to the heat sink, the solid state device must be securely clamped to the heat sink. It is also desirable to have the solid state device mounted to the heat sink with a device that will permit its easy installation with the heat sink and also with the associated circuit board. Further, it is desirable to have the solid state device (heat generating device) in close proximity to the associated circuit board so as to minimize the length of the conductors required for connecting the solid state device to the circuit board.

The following U.S. patents illustrate devices utilized as heat sinks to dissipate heat from electrical components to the ambient conditions. They are U.S. Pat. Nos. 4,674,005, entitled "Multiple Fastening Clip and Device for the Collective Mounting of Electronic Power Components", issued June 16, 1987 to Lacz; 4,669,028, entitled "Heat Sink for Solid State Devices Connected to a Circuit Board", issued May 26, 1987 to Faa, Jr.; 4,625,260, entitled "Fasteners for Surface Mounting of Printed Circuit Board Components", issued Nov. 25, 1986 to Jordan et al; 4,613,925, entitled "Sensor Attachment Assembly", issued Sept. 23, 1986 to Mohri et al; 4,609,040, entitled "Self-Securing Heat Sink", issued Sept. 2, 1986 to Moore; 4,509,839, entitled "Heat Dissipator for Semiconductor Devices", issued Apr. 9, 1985 to Lavochkin; 4,444,994, entitled "Electrically Insulated Quick Disconnect Heat Sink", issued Apr. 24, 1984 to Baker et al; 4,288,839, entitled "Solid State Device Mounting and Heat Dissipating Assembly", issued Sept. 8, 1981 to Prager et al; 4,259,685, entitled "Clamp for Securing an Encased Power Frame to a Heat Sink", issued Mar. 31, 1981 to Romano; 4,203,488, entitled "Self-Fastened Heat Sinks", issued May 20, 1980 to Johnson et al; 4,115,836, entitled "Cooling System for Dual-In-Line Packages", issued Sept. 19, 1978 to Hutchison et al; 3,893,161, entitled "Frictionally Engageable Heat Sink For Solid State Devices", issued July 1, 1975 to Pesak, Jr.; 3,711,752, entitled "Semiconductor Device and Method of Assembling the Same", issued Jan. 16, 1973 to Nier; and IBM Technical Disclosure Bulletin, Volume 24, No. 7B, Dec., 1981.

While the above art appears to perform satisfactorily to dissipate heat from the electrical components, it has several disadvantages. One disadvantage is that several of the above devices utilize removable fasteners such as screws, nuts and bolts, and the like to fasten the device to the heat sink. With the cycling (heating and cooling) of the electrical components, it is possible that these connections will be loosened and eventually come off due to the cycling. Several of the above devices are very complex and require a significant amount of assembly.

Accordingly, it is an object of the present invention to overcome the disadvantages of the above art. The present invention provides the art with a heat sink assembly utilizing a frictionally and interference secured biasing member to position the electrical components against the heat sink material. The present invention provides the art with a heat sink assembly that may be assembled by automated processes.

Accordingly, the present invention provides the art with a new and improved heat sink assembly. The heat sink assembly includes a housing formed from a suitable heat sinking material. The housing includes a body with integral continuous walls extending from the perimeter of the body. A carrier mechanism for retaining a plurality of electrical components is positioned within the housing such that heat sink tabs on the electrical components are coupled with the housing to dissipate heat from the electrical components to the housing. The housing dissipates heat to its external ambient. The housing, therefore, functions not only to mechanically protect the internal electronic components but also functions as a heat sink for certain electronic components. A resilient biasing member including a plurality of resilient fingers is coupled with the carrier mechanism to retain the carrier mechanism and electrical components in position on the housing.

Unlike most conventional circuit board mounted heat sinks, the present invention utilizes the walls of an electronic module's housing to act as a heat sink, thus dissipating unwanted heat to the electronic module's exterior.

From the subsequent description and claims taken in conjunction with the accompanying drawings, other objects and advantages of the present invention will become apparent to those skilled in the art.

BRIEF DESCRIPTION OF THE DRAWINGS

FIG. 3 is a cross-section view of FIG. 2 along line 3—3 thereof.

FIG. 4 is a cross-section view of FIG. 2 along line 4—4 thereof.

FIG. 5 is a partial plan view of a resilient biasing member in accordance with the present invention.

FIG. 6 is a side elevation view of FIG. 5.

FIG. 7 is a side elevation view, partially in cross-section, of another embodiment of a resilient biasing member in accordance with the present invention.

FIG. 8 is a side elevation view, partially in cross-section, of another embodiment of a resilient biasing member in accordance with the present invention.

FIG. 9 is a partial perspective view of an assembled heat sink assembly in accordance with the present invention.

FIG. 10 is a partial top plan view of another embodiment of a solid state device in accordance with the present invention.

FIG. 11 is a cross-section view of FIG. 10 along line 11—11 thereof.

FIG. 12 a cross-section view of FIG. 11 along line 12—12 thereof.

FIG. 13 is a partial perspective view of another embodiment of a heat sink assembly in accordance with the present invention.

FIG. 14 is a cross-section view of FIG. 13 along a line 14—14 thereof.

DETAILED DESCRIPTION OF THE PREFERRED EMBODIMENT

Figure 1:
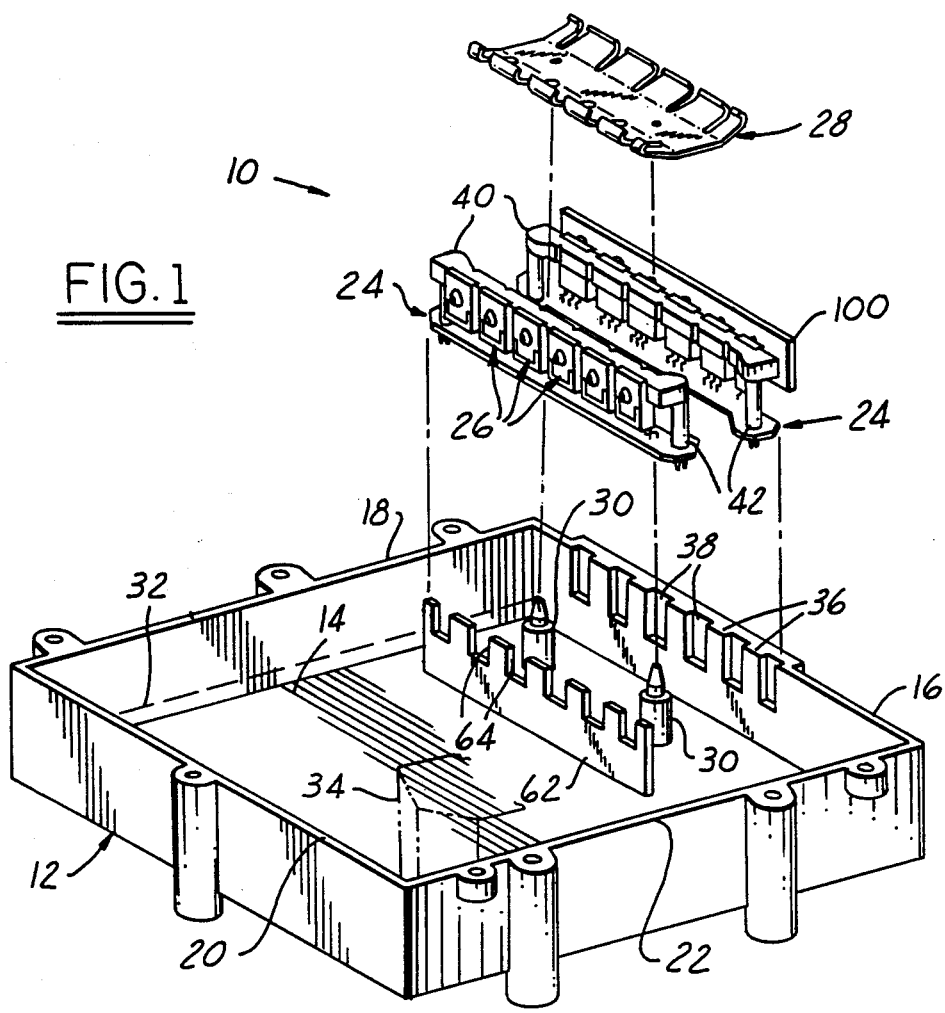
FIG. 1 is an exploded perspective view of a heat sink assembly in accordance with the present invention.

Referring to the Figures, particularly FIG. 1, a heat sink assembly is shown and designated with the reference numeral 10. The heat sink assembly 10 generally includes a housing 12 having a rectangular body 14 and integral continuous walls 16, 18, 20 and 22 projecting from the perimeter of the body 14. The housing 12 is generally formed from a suitable heat sink material such as aluminum or the like. Carrier mechanisms 24, retaining a plurality of electrical components 26, are generally positioned within the housing 12. A resilient biasing member 28 is coupled with the carrier mechanisms 24 to secure the carrier mechanisms 24 within the housing 12.

The housing 12 further includes projecting posts 30 to provide securement and location of the resilient biasing member 28 to the housing 12. A circuit board or the like 32 is generally positioned on top of the housing body 14. A connector 34 (shown in phantom) interfaces the circuit board(s) in housing 12 with other parts of external electrical components/system (not shown). Generally, one of the wall members 16 includes a plurality of ribs 36 and channels 38 to enable installation of a carrier bar 40. Also, a cover (not shown) is secured on top of the walls 16, 18, 20 and 22 to protect the electrical components when the housing is mounted within a passenger compartment or engine compartment of a vehicle or other environment where the circuit board needs protection. The use is not restricted to the automotive environment.

The carrier mechanism 24 generally includes a carrier bar 40 having a pair of support legs 42 extending therefrom. Retaining members 48, having a neck 50 and head 52, are formed at the other end of the support leg 42 and are frictionally inserted into apertures in the circuit board 32 to retain the carrier mechanisms 24 on the circuit board 32.

The carrier bar 40 includes retaining members 54, similar to the retaining members 48 on the support legs 42, having a neck portion 56 and a head portion 58. The neck portion 56 has a length substantially equal to the thickness of the heat sink tabs 60 of the electrical components 26. The retaining member 54 is pushed through an aperture 61 in the heat sink tab 60 to retain the electrical components 26 in recesses 63 on the carrier bar 40 of the carrier mechanism 24.

The carrier bar 40 is generally of a suitable plastic material having a flexibility (via material selection and mechanical design) to accommodate minor varying thicknesses of the heat sink tabs 60.

Figure 2:
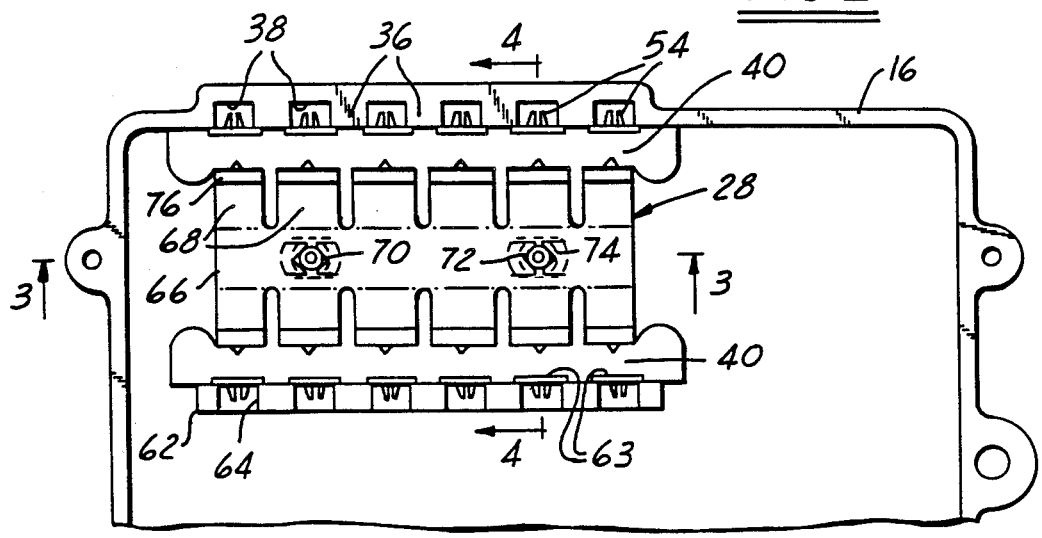
FIG. 2 is an assembled partial top plan view of FIG. 1.

The heat sink tabs 60 are positioned against the wall 16 such that the retaining members 54 project into the channels 38 between ribs 36, as seen in FIG. 2. The heat sink tabs 60 abut against successive ribs 36 to contact the metallic tabs 60 with the metallic housing to dissipate heat from the electrical components 26 to the housing 12.

A lead alignment plate 44 is coupled with the carrier support legs 42 to align the leads 46 of the electrical components 26 to enable them to be inserted into the circuit board 32, as seen in FIG. 4. The lead alignment plate 44 includes a plurality of apertures to pass the leads 46 through the plate and align the leads 46 with apertures in the circuit board.

An interior wall 62 may project from the housing body 14 within its perimeter. The wall 62 provides additional heat sink capability and enables a second carrier mechanism 24 to be positioned against it. A plurality of grooves 64 are cut into the wall 62 to enable the retainers 54 of the carrier bar 40 to project therethrough. The wall 62 dissipates heat from the tabs 60 of electrical components 26 to the housing 12.

The resilient biasing member 28 includes a body 66 and a plurality of angularly extending fingers 68. The body 66 is generally planar having at least one aperture 70 with a pair of retaining leaves 72 and 74 to secure the resilient biasing member 28 onto the housing post 30. The fingers 68 may have a curved end 76 for retention of the carrier mechanism 24.

Generally, the number of fingers 68 correspond with the number of electrical components 26 that are to be retained in the carrier mechanism 24. The fingers 68 may provide varying amounts of force to be exerted onto the electrical components 26 to forcibly retain the components 26 against the walls 16 and 62. The varying of the exerted force in each individual finger 68 enables multiple types of electrical components 26 to be utilized in the system. The plurality of fingers 68 are aligned such that each finger 68 is paired with an individual electrical component 26 to forcibly position the heat sink tab 60 of each electrical component 26 against the housing walls 16 and 62 to dissipate heat from the electrical components 26 to the housing 12, as seen in FIGS. 2 through 4. The individual fingers 68 enable use of varying thicknesses of heat sink tab 60. The spring action of the fingers 68 provides constant retention of the heat sink tabs 60 to the housing walls 16 and 62 during thermal expansion/contraction conditions imposed by the environment in which the housing is used.

The electrical components 26 could be of several types, however, those which work particularly well are designated as having TO-220 type cases.

FIGS. 7 and 8 illustrate other embodiments of resilient members in accordance with the present invention. In FIG. 7, a resilient biasing member 80 is illustrated with a body member 82 and projecting angular fingers 84. The angular fingers 84 are substantially planar and contact the carrier bar 40 to forcibly secure the electrical components 26 against the housing wall 16 and interior wall 62.

FIG. 8 illustrates another type of resilient biasing member 90 that may be utilized in the present invention. The biasing member 90 has a body 92 and a plurality of extending angular fingers 94. The fingers 94 have an angular flange 96 depending from their end to further enhance the force exerted on the electrical components 26 to secure the tabs 60 of the electrical components 26 against the walls 16 and 62.

Also, insulating material such as insulating tape 100 may be positioned between the electrical components 26 and the walls 16 and 62. The insulating material 100 electrically insulates the components 26 from the walls 16 and 62. However, the electrical insulating tape 100 acts as a conductor to dissipate heat from the electrical components 26 to the housing walls 16 and 62. Thus, the insulating material 100 insulates against electricity while conducting heat from the electrical components 26 to the housing 12.

Moving to FIGS. 9, 10 and 11; FIG. 9 illustrates a heat sink assembly 10 substantially the same as that in FIG. 1. FIGS. 10 and 11 show another embodiment of the present invention. The housing 12, carrier members 24, and electrical components 26 are substantially the same as described herein.

The biasing member 120 includes spring fingers 122 and fingers 124. The fingers 122 are shorter than the fingers 124. The fingers 122, as illustrated in FIGS. 10 and 11, abut the support legs 42 of the carrier mechanisms 24 while fingers 124 abut the carrier bar 40. Thus, the fingers 122 and 124 force the carrier mechanisms 24 against the walls 16 and 62. Fingers 124 may have the same or different widths according to the force necessary to abut their particular electrical component 26 against the walls 16 and 62. Generally, this type of spring is utilized when a fewer number of electrical components 26 abut one wall 62 than abut the other wall 16.

The spring fingers 122 and 124, other than having a different length and varying widths, are substantially identical to one another. That is, the spring contains a body 128 with the fingers 122 and 124 angularly projecting therefrom. Curved ends 76 (essentially the same as described above) are formed at the end of the fingers 122 and 124. The body 128 has apertures 70 with retaining leaves 72 and 74, like those described herein, to retain the biasing member 120 onto the housing post 30.

FIG. 12 illustrates the carrier retaining member 48 which secures the support leg 42 to the lead plate 44 and circuit board 32. The neck 142 generally has a peripheral tang 144 to seat the lead alignment plate 44 thereon. Also, a head 52 is at the terminus of the neck 142 to retain the carrier members 24 to the circuit board 32. A slot 148 is cut through the retaining member 48 from the head 52 through the neck 142 to the support leg 42. The slot 148 enables the head 52 and neck 142 to be squeezed together to enable the head 52 and neck 142 to pass through the apertures 150 and 50 in the lead plate 44 and circuit board 32, respectively, to retain the lead plate 44 on the support leg 42 and to retain the support leg 42 in the circuit board 32.

The lead alignment plate 44 holds the leads 46 in position prior to insertion of the carrier mechanism 24 into the circuit board 32. The lead alignment plate 44 is an aid for insertion of multiple electrical components 26 in one operation.

Turning to FIGS. 13 and 14, another embodiment of the present invention is shown. Turning to FIG. 13, a biasing member 160 is illustrated having a single row of biasing fingers 162. The housing 12 is substantially the same as that herein described. The wall 16 is substantially identical to that described herein. The housing 12 does not include an interior wall member. The resilient member 160 includes a body 164 having angularly projecting fingers 162.

As seen in FIG. 14, the body member 164 has apertures and retaining leaves like those herein described to retain the biasing member 160 onto the housing post 30. Thus, it can be seen that the resilient biasing member 160 includes a single row of fingers to forcibly retain a plurality of electrical components 26 against the housing wall 16 including ribs 36 and channels 38. Also, the resilient member may include two rows of fingers to retain electrical components 26 against both of the housing walls 16 and 62 as described herein.

Generally, the above described heat sink assembly is manufactured in accordance with the following. A housing, like that described herein, carrier means, at least one electrical component having a heat sink tab, and a resilient biasing member having at least one finger are provided for assembly on an automated assembly line. The housing is positioned onto the assembly line by automated techniques. The carrier with its electrical components already positioned thereon are positioned into apertures in the circuit board by automated techniques. The desired components such as circuit boards and the like are then added to the housing. The resilient biasing member is coupled with the carrier member such that the heat sink tabs of the electrical components on the carrier mechanisms are coupled with the housing to dissipate heat from the electrical components to the housing. The biasing member is located and retained by its apertures onto posts projecting from the housing. The biasing member is positioned onto the post and forced downwardly to be secured to the post by automated methods. As the resilient member is forcibly secured onto the post, each finger exerts a desired force onto the specific electrical component to which it is aligned. The desired force exerted by the resilient fingers enables a plurality of different electrical components to be positioned on the carrier and forcibly pushed against the housing for dissipating heat from the electrical components to the housing.

While the above discloses the preferred embodiment of the present invention, it will be understood that modifications, variations, and alterations may be made to the present invention without varying from the scope and fair meaning of the subjoined claims.

What is claimed is:

1. A heat sink assembly comprising:
   a unitary heat sink housing formed from a suitable heat sinking material, said housing receiving a circuit board, said circuit board positioned within said housing and containing a plurality of electrical components;
   carrier means coupled with said circuit board and retaining the plurality of electrical components thereon such that heat sink tabs of said electrical components contact said unitary heat sink housing for dissipating heat from said electrical components to said housing, said carrier means providing the direct mechanical support for said electrical components; and
   resilient biasing means fixed with respect to said housing and including a plurality of resilient fingers contacting said carrier means and retaining said carrier means and electrical components in position on said housing.

2. The heat sink assembly according to claim 1 wherein said resilient biasing means is comprised of a finger spring having a body, said plurality of fingers angularly projecting from said body.

3. The heat sink assembly according to claim 2 wherein said plurality of fingers corresponds to the number of electrical components on said carrier means such that each finger is aligned with each electrical component to forcibly position said heat sink tab of each electrical component against said housing.

4. The heat sink assembly according to claim 3 wherein each of said fingers exerts a desired force on each of said electrical components enabling multiple types of electrical components to be retained by said carrier means.

5. The heat sink assembly according to claim 1 wherein said carrier means is positioned such that said electrical components are abutted against a housing wall.

6. The heat sink assembly according to claim 5 wherein a plurality of ribs and channels are formed in said abutted wall for installation of said carrier means.

7. The heat sink assembly according to claim 1 further comprising an interior wall of suitable heat sinking material projecting from said housing within the perimeter of said housing wherein said carrier means and electrical components are further coupled with said interior wall by said resilient biasing means for dissipating heat from said electrical components to said interior wall and said housing.

8. The heat sink assembly according to claim 1 wherein means for electrically insulating said electrical components from said heat sink material housing is positioned between said housing and said electrical components, said electrical insulating means dissipating heat from said electrical components to said housing.

9. A heat sink assembly comprising:
a unitary heat sink housing formed of a suitable heat sink material having a base with at least one wall extending from the base, said base and wall receiving a circuit board;
said circuit board mounted to the base within said housing;
means carrying a plurality of electrical components thereon, said carrier means coupled with said circuit board and positioned within said housing such that said electrical components connect to said circuit board and heat sink tabs on said electrical components contact said housing wall for dissipating heat from said electrical components to said housing wall, said carrier means providing the direct mechanical support for said electrical components; and
a spring fixed with respect to said housing and having a plurality of resilient biasing fingers, said spring contacting said carrier means such that said resilient biasing fingers forcibly position said heat sink tabs of said electrical components against said housing wall.

10. The heat sink assembly according to claim 9 wherein at least one post projects vertically from said base which couples said spring with said housing for retaining aid carrier means in position.

11. The heat sink according to claim 10 wherein said spring includes at least one aperture with locking fingers which secures said spring on said post by friction and interference.

12. The heat sink assembly according to claim 9 wherein each of said fingers exerts a desired force on each of said electrical components enabling multiple types of electrical components to be retained by said carrier means.

13. The heat sink assembly according to claim 9 wherein a plurality of ribs and channels are formed in said housing wall for installation of said carrier means.

14. The heat sink assembly according to claim 9 further comprising an interior wall of suitable heat sinking material projecting from said base within the perimeter of said base wherein said carrier means and electrical components are further coupled with said interior wall by said resilient biasing means for dissipating heat from said electrical components to said interior wall and said housing.

15. The heat sink assembly according to claim 9 wherein means for electrically insulating said electrical components from said heat sink material housing is positioned between said housing and said electrical components, said electrical insulating means dissipating heat from said electrical components to said housing.

16. A heat sink assembly comprising:
a unitary heat sink housing formed from a suitable heat sink material, said heat sink housing including one or more ribs and one or more channels alternately positioned on said housing, said housing receiving a circuit board;
said circuit board positioned within said housing and containing a plurality of electrical components;
carrier means coupled with said circuit board and retaining said electrical components thereon, said electrical components having heat sink tabs in an abutting relationship with said housing such that said one or more ribs and channels are adjacent said electrical components and heat dissipates from said electrical components to said heat sink housing, said carrier means providing the direct mechanical support for said electrical components; and
resilient biasing means fixed with respect to said housing and including a plurality of resilient fingers contacting said carrier means and retaining said carrier means and electrical components in position on said housing.

17. The heat sink assembly according to claim 16 further comprising means forcefully urging said heat sink tabs of said electrical components into intimate contact with said housing.

18. The heat sink assembly according to claim 16 wherein said housing has a base and at least one wall projecting from said base.

19. The heat sink assembly according to claim 18 further comprising said plurality of ribs and channels formed in said wall which abut said heat sink tabs of said electrical components.

20. The heat sink assembly according to claim 16 wherein means for electrically insulating said electrical components from said heat sink material housing is positioned between said housing and said electrical components, said electrical insulating means dissipating heat from said electrical components to said housing.

* * * * *